United States Patent [19]
Ahn et al.

[11] Patent Number: 5,598,155
[45] Date of Patent: Jan. 28, 1997

[54] VARIABLE LENGTH DECODING METHOD AND APPARATUS

[75] Inventors: Wooyoun Ahn, Songtan; Myong-rae Cho, Seoul, both of Rep. of Korea

[73] Assignee: Samsung Electronics Co., Ltd., Kyungki-Do, Rep. of Korea

[21] Appl. No.: 536,305

[22] Filed: Sep. 26, 1995

[30] Foreign Application Priority Data

Sep. 26, 1994 [KR] Rep. of Korea .................. 94-24148

[51] Int. Cl.$^6$ .................................................. H03M 7/40
[52] U.S. Cl. .................................................. 341/67; 341/106
[58] Field of Search .................................. 341/55, 67, 106

[56] References Cited

U.S. PATENT DOCUMENTS

| 5,173,695 | 12/1992 | San et al. | 341/67 |
| 5,245,338 | 9/1993 | Sun | 341/67 |

*Primary Examiner*—Todd E. DeBoer
*Attorney, Agent, or Firm*—Sughrue, Mion, Zinn, Macpeak & Seas

[57] ABSTRACT

A variable length decoding apparatus contains a variable length code table of variable length codes which are used to decode variable length coded data and which are grouped together based on bit patterns of the variable length codes. The apparatus also includes a memory for storing the coded data in increments of N-bit data and for outputting a current N-bit data based on control signals generated in accordance with the contents of a previous N-bit data output from the memory. The apparatus also includes a controller which inputs the current N-bit data and compares the N-bit data with code state values that respectively identify the groups of the variable length codes. As a result, the controller determines the group of codes to which the current N-bit data belongs and outputs control signals based on such determination. Furthermore, the apparatus contains a combination logic portion having a plurality of input combinations, the values of which are determined based on the previous N-bit data and the current N-bit data. Moreover, the values of the input combinations respectively correspond to decoded symbols for each of the groups of variable length codes. Subsequently, a multiplexer inputs the plurality of decoded symbols and selectively outputs the symbol corresponding to the current N-bit data based on a control signal from the controller.

22 Claims, 5 Drawing Sheets

| GROUP | VARIABLE LENGTH CODE | RUN | LEVEL |
|---|---|---|---|
| EOB | 10 | | |
| ESC | 0000 01 | | |
| S0 | 1s<br>11s<br>011s<br>0100s<br>0101s | 0<br>0<br>1<br>0<br>2 | 1<br>1<br>1<br>2<br>1 |
| S1 | 0011 1s<br>0011 0s | 3<br>4 | 1<br>1 |
| S2 | 0001 10s<br>0001 11s<br>0001 01s<br>0001 00s | 1<br>5<br>6<br>7 | 2<br>1<br>1<br>1 |
| S3 | 0000 110s<br>0000 100s<br>0000 111s<br>0000 101s | 0<br>2<br>8<br>9 | 4<br>2<br>1<br>1 |
| S4 | 0010 1s<br>0010 0110s<br>0010 0001s<br>0010 0101s<br>0010 0100s<br>0010 0111s<br>0010 0011s<br>0010 0011s<br>0010 0000s | 0<br>0<br>0<br>1<br>3<br>10<br>11<br>12<br>0 | 3<br>5<br>6<br>3<br>2<br>1<br>1<br>1<br>7 |

FIG. 3B

| GROUP | VARIABLE LENGTH CODE | RUN | LEVEL |
|---|---|---|---|
| S5 | 0000 0010 10s | 0 | 7 |
| | 0000 0011 00s | 1 | 4 |
| | 0000 0010 11s | 2 | 3 |
| | 0000 0011 11s | 4 | 2 |
| | 0000 0011 01s | 5 | 2 |
| | 0000 0011 10s | 14 | 1 |
| | 0000 0011 01s | 15 | 1 |
| | 0000 0010 00s | 16 | 1 |
| S6 | 0000 0001 1101s | 0 | 8 |
| | 0000 0001 1000s | 0 | 9 |
| | 0000 0001 0011s | 0 | 10 |
| | 0000 0001 0000s | 0 | 11 |
| | 0000 0001 1011s | 1 | 5 |
| | 0000 0001 0100s | 2 | 4 |
| | 0000 0001 1100s | 3 | 3 |
| | 0000 0001 0010s | 4 | 3 |
| | 0000 0001 1110s | 6 | 2 |
| | 0000 0001 0101s | 7 | 2 |
| | 0000 0001 0001s | 8 | 2 |
| | 0000 0001 1111s | 17 | 1 |
| | 0000 0001 1010s | 18 | 1 |
| | 0000 0001 1001s | 19 | 1 |
| | 0000 0001 0111s | 20 | 1 |
| | 0000 0001 0110s | 21 | 1 |
| S7 | 0000 0000 1101 0s | 0 | 12 |
| | 0000 0000 1100 1s | 0 | 13 |
| | 0000 0000 1100 0s | 0 | 14 |
| | 0000 0000 1011 1s | 0 | 15 |
| | 0000 0000 1011 0s | 1 | 6 |
| | 0000 0000 1010 1s | 1 | 7 |
| | 0000 0000 1010 0s | 2 | 5 |
| | 0000 0000 1001 1s | 3 | 4 |
| | 0000 0000 1001 0s | 5 | 3 |
| | 0000 0000 1000 1s | 9 | 2 |
| | 0000 0000 1000 0s | 10 | 2 |
| | 0000 0000 1111 1s | 22 | 1 |
| | 0000 0000 1110 0s | 23 | 1 |
| | 0000 0000 1110 1s | 24 | 1 |
| | 0000 0000 1110 0s | 25 | 1 |
| | 0000 0000 1101 1s | 26 | 1 |

FIG. 3C

| GROUP | VARIABLE LENGTH CODE | RUN | LEVEL |
|---|---|---|---|
| S8 | 0000 0000 0111 11s | 0 | 16 |
| | 0000 0000 0111 10s | 0 | 17 |
| | 0000 0000 0111 01s | 0 | 18 |
| | 0000 0000 0111 00s | 0 | 19 |
| | 0000 0000 0110 11s | 0 | 20 |
| | 0000 0000 0110 10s | 0 | 21 |
| | 0000 0000 0110 01s | 0 | 22 |
| | 0000 0000 0110 00s | 0 | 23 |
| | 0000 0000 0101 11s | 0 | 24 |
| | 0000 0000 0101 10a | 0 | 25 |
| | 0000 0000 0101 01s | 0 | 26 |
| | 0000 0000 0101 00s | 0 | 27 |
| | 0000 0000 0100 11s | 0 | 28 |
| | 0000 0000 0101 10s | 0 | 29 |
| | 0000 0000 0101 01s | 0 | 30 |
| | 0000 0000 0101 00s | 0 | 31 |
| S9 | 0000 0000 0011 000s | 0 | 32 |
| | 0000 0000 0010 111s | 0 | 33 |
| | 0000 0000 0010 110s | 0 | 34 |
| | 0000 0000 0010 101s | 0 | 35 |
| | 0000 0000 0010 100s | 0 | 36 |
| | 0000 0000 0010 011s | 0 | 37 |
| | 0000 0000 0010 010s | 0 | 38 |
| | 0000 0000 0010 001s | 0 | 39 |
| | 0000 0000 0010 000s | 0 | 40 |
| | 0000 0000 0011 111s | 1 | 8 |
| | 0000 0000 0011 110s | 1 | 9 |
| | 0000 0000 0011 101s | 1 | 10 |
| | 0000 0000 0011 100s | 1 | 11 |
| | 0000 0000 0011 011s | 1 | 12 |
| | 0000 0000 0011 010s | 1 | 13 |
| | 0000 0000 0011 001s | 1 | 14 |
| S10 | 0000 0000 0001 0011s | 1 | 15 |
| | 0000 0000 0001 0010s | 1 | 16 |
| | 0000 0000 0001 0001s | 1 | 17 |
| | 0000 0000 0001 0000s | 1 | 18 |
| | 0000 0000 0001 0100s | 6 | 3 |
| | 0000 0000 0001 1010s | 11 | 2 |
| | 0000 0000 0001 1001s | 12 | 2 |
| | 0000 0000 0001 1000s | 13 | 2 |
| | 0000 0000 0001 0111s | 14 | 2 |
| | 0000 0000 0001 0110s | 15 | 2 |
| | 0000 0000 0001 0101s | 16 | 2 |
| | 0000 0000 0001 1111s | 27 | 1 |
| | 0000 0000 0001 1110s | 28 | 1 |
| | 0000 0000 0001 1101s | 29 | 1 |
| | 0000 0000 0001 1100s | 30 | 1 |
| | 0000 0000 0001 1011s | 31 | 1 |

યુ.S. Patent No. 5,598,155

VARIABLE LENGTH DECODING METHOD AND APPARATUS

FIELD OF THE INVENTION

The present invention relates to a method and apparatus for decoding variable length coded data. More particularly, the present invention relates to a variable length decoding method and apparatus which has a simple hardware construction for performing a variable length decoding operation and which is capable of maintaining an existing processing speed when performing the variable length decoding operation.

BACKGROUND OF THE INVENTION

In many electronic devices (e.g. high-definition televisions (HD-TVs), high-definition video cassette recorders (HD-VCRs), digital VCRs, digital camcorders, and multi-media systems), both a video signal and an audio signal are digitally processed, and the processed signals are recorded on a recording medium or transmitted to another reproducing apparatus. Several methods for digitally processing the video information include a prediction coding method, an orthogonal transform coding method, and a variable length coding method. In order to execute the methods above, typical coding systems perform an orthogonal transform coding operation, a quantization operation, and a variable length coding operation. Furthermore, such operations are performed on a predetermined portion (i.e. block) of the video signal in order to effectively compress video information. Moreover, such systems perform a prediction coding operation between frames or fields of the video information in order to further enhance the data compression rate.

The above-described variable length coding apparatuses compress information based on symbols contained within the video information, and a variable length code table is stored for coding the input symbols. In particular, the variable length coding table is created according to the well known Huffman coding technique. According to such technique, shorter codes are assigned to symbols which occur more frequently, and longer codes are assigned to symbols which occur less infrequently.

In a typical coding system, symbols which are input to a variable length coding apparatus are [run, level] symbols that are generated based on a run-length coding operation. For example, the [run, level] symbols may be obtained in accordance with a well-known zig-zag scan. Specifically, the "run" represents the number of "0"s which sequentially exist between non-zero transform coefficients obtained by the zig-zag scan, and the "level" represents a value of the non-zero transform coefficient.

In addition to being created based on the Huffman coding technique, the table may be divided into an escape region and a regular region. In particular, the escape region contains codes in which either the "run" or "level" has a large value, and the regular region represents all of the other situations. The [run, level] symbols located in the regular region are assigned codes according to the Huffman coding technique. On the other hand, the [run, level] symbols in the escape region are assigned and escape (ESC) code and a longer code since the [run, level] symbols in the escape region occur infrequently. Based on the data in the code table, the [run, level] symbols are converted into a bitstream of data in which additional information such as the ESC code and an end of block (EOB) code representing the end of a block of data is added. Subsequently, the bitstream of data is transmitted to a decoding system.

The decoding system performs a decoding operation which is the inverse of the signal processing operation of the coding system. Specifically, the decoding system comprises a variable length decoder, an inverse quantizer, and an inverse orthogonal transformer to decode the coded information.

Figure 1:
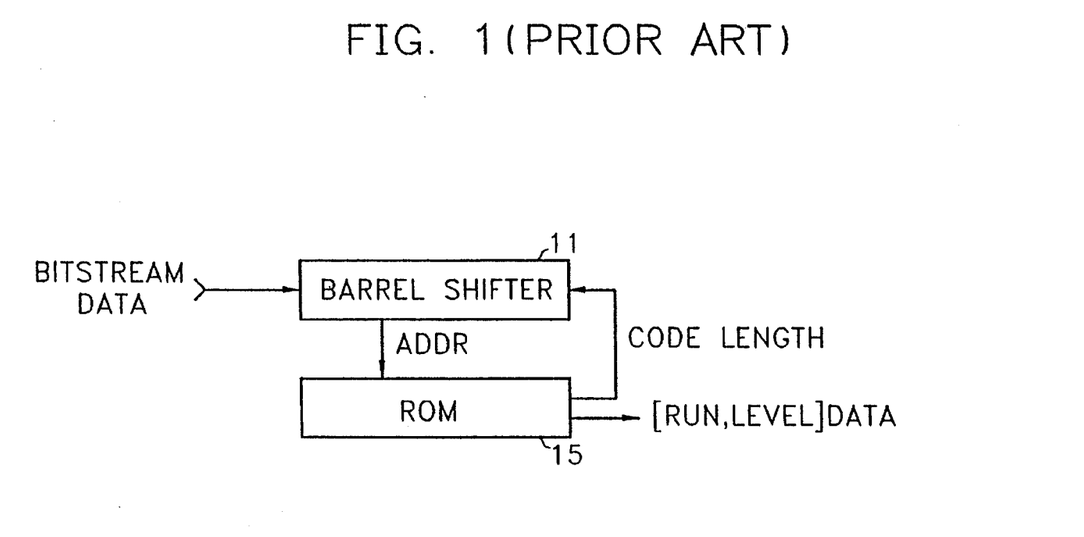
FIG. 1 is a block diagram of a conventional variable length decoder for decoding variable-length-coded data.

A conventional variable length decoder is illustrated in FIG. 1. As illustrated in the figure, the conventional decoder comprises a barrel shifter 11 and a Read Only Memory (ROM) 15. The barrel shifter 11 inputs a bitstream of data and outputs certain data bits to the ROM 15 as address data ADDR. Then, the ROM 15 reads the [run, level] symbols stored at the address location designated by the address data ADDR and outputs the [run, level] symbols to the inverse quantizer (not shown).

Furthermore, the ROM 15 generates a code length symbol based on the output [run, level] symbol and supplies the code length symbol to the barrel shifter 11. Subsequently, the barrel shifter 11 outputs another predetermined set of data bits as the address data ADDR based on the code length signal. The barrel shifter 11 and the ROM 15 repeat the operations above to continuously perform the variable length decoding operation.

Since the apparatus illustrated in FIG. 1 can generate a single [run, level] symbol with a single shift operation and a single reading operation (usually two clock pulse periods) regardless of the code length of the [run, level] symbols, the apparatus can consistently operate at a constant speed and can operate at a high frequency. However, the variable length decoding apparatus requires a ROM 15 for storing the variable length coding table and a barrel shifter 11 for generating address data ADDR for the ROM 15. Thus, when such a variable length decoding apparatus is manufactured as an application specific integrated circuit (ASIC), the complexity of the hardware and the cost of the apparatus increases.

SUMMARY OF THE INVENTION

In order to solve the above problems, it is an object of the present invention to provide a method for performing a variable length decoding operation based on the similarity of characteristics of the data representing the variable length codes constituting the variable length code table proposed by the Moving Picture Experts Group (MPEG) II.

Another object of the present invention is to provide an apparatus which has relatively simple hardware and which is capable of performing a variable length decoding operation at a certain processing speed based on the similarity of characteristics of the data representing the variable length codes constituting a variable length code table proposed by the Moving Picture Experts Group (MPEG) II.

To accomplish the one of the above objects of the present invention, there is provided a variable length decoding method. The method comprised the steps of (a) establishing code state values for selecting a particular group from a plurality of groups, wherein said plurality of groups comprise variable length codes of a variable length code table and said particular group comprises a particular variable length code relating to a current N-bit data; (b) establishing a plurality of input combinations which have values that are determined by said current N-bit data and previous N-bit data, wherein said plurality of input combinations respectively correspond to said plurality of groups, and wherein a plurality of symbols respectively correspond to said values of said plurality of input combinations; (c) storing and outputting variable length coded data in increments of N-bit data, wherein said current N-bit data is an increment of said N-bit data which is currently output and said previous N-bit data is another increment of said N-bit data which is output before said current N-bit data, wherein said current N-bit data is output by shifting a first bit of said previous N-bit data to a first bit of said current N-bit data in accordance with a value of a control signal; (d) determining said particular group corresponding to said current N-bit data by comparing said code state values established in step (a) with said current N-bit data output in step (c), wherein a code length signal representing a number of bits of one of said code state values used to determine said particular group, a select signal representing said particular group, and said previous N-bit data are output after determining said particular group; and (e) determining a plurality of symbols based on said current N-bit data and said previous N-bit data output in step (c), wherein said plurality of symbols correspond to said values of said plurality of input combinations.

The other object of the present invention is accomplished by providing a variable length decoding apparatus. The apparatus comprises memory means for storing and outputting variable length coded data in increments of N-bit data, wherein an increment of said N-bit data which is currently output from said memory means is a current N-bit data, and another increment of said N-bit data which is output before said current N-bit data is a previous N-bit data, wherein said memory means outputs said previous N-bit data and shifts said previous N-bit data from an initial bit of said previous N-bit data by a value of a control signal, and wherein said memory means subsequently outputs said current N-bit data which has an initial bit that is determined by shifting said previous N-bit data.

In addition, the apparatus comprises control means for inputting said previous and current N-bit data and for determining a particular group of a plurality of groups to which said current N-bit data belongs, wherein said plurality of groups comprise variable length codes of a variable length code table and are formed based on characteristics of said variable length codes, wherein said control means determines said particular group by comparing code state values with said current N-bit data, wherein said code state values respectively correspond to said plurality of groups of said variable length codes, and wherein said control means outputs a code length signal which represents a number of bits of one of said code state values used to determine said particular group, a select signal which represents said particular group, and said previous N-bit data.

Also, the apparatus comprises combination logic means for generating a plurality of symbols, wherein said combination logic means comprises a plurality of input logic combinations which respectively correspond to said plurality of groups, wherein values of said plurality of input logic combinations are determined based on said previous N-bit data output from said control means and said current N-bit data output from said memory means, wherein said plurality of symbols are respectively obtained for each of said plurality of groups based on said values of said input logic combinations.

Finally, the apparatus comprises a multiplexer for receiving said plurality of symbols generated by said combination logic means and for selectively outputting a selected symbol from said plurality of symbols based on said select signal from said control means.

BRIEF DESCRIPTION OF THE DRAWINGS

The preferred embodiments are described with reference to the drawings wherein.

DETAILED DESCRIPTION OF THE PREFERRED EMBODIMENT

A preferred embodiment of the present invention relates to a system for decoding input data based on the characteristics of variable length code tables and will be described below in more detail with reference to FIGS. 2 to 3C. However, prior to describing the variable length decoding system of the present invention, the characteristics of the variable length code tables will be described below with reference to FIGS. 3A to 3C. As illustrated in the figures, the tables comprise data for coding the DCT coefficients of a video signal. The DCT coefficients are generated via a discrete cosine transform method which generates the DCT coefficients by orthogonally transforming the pixel values contained within a block of a video signal having M×N pixels.

Figure 3A:
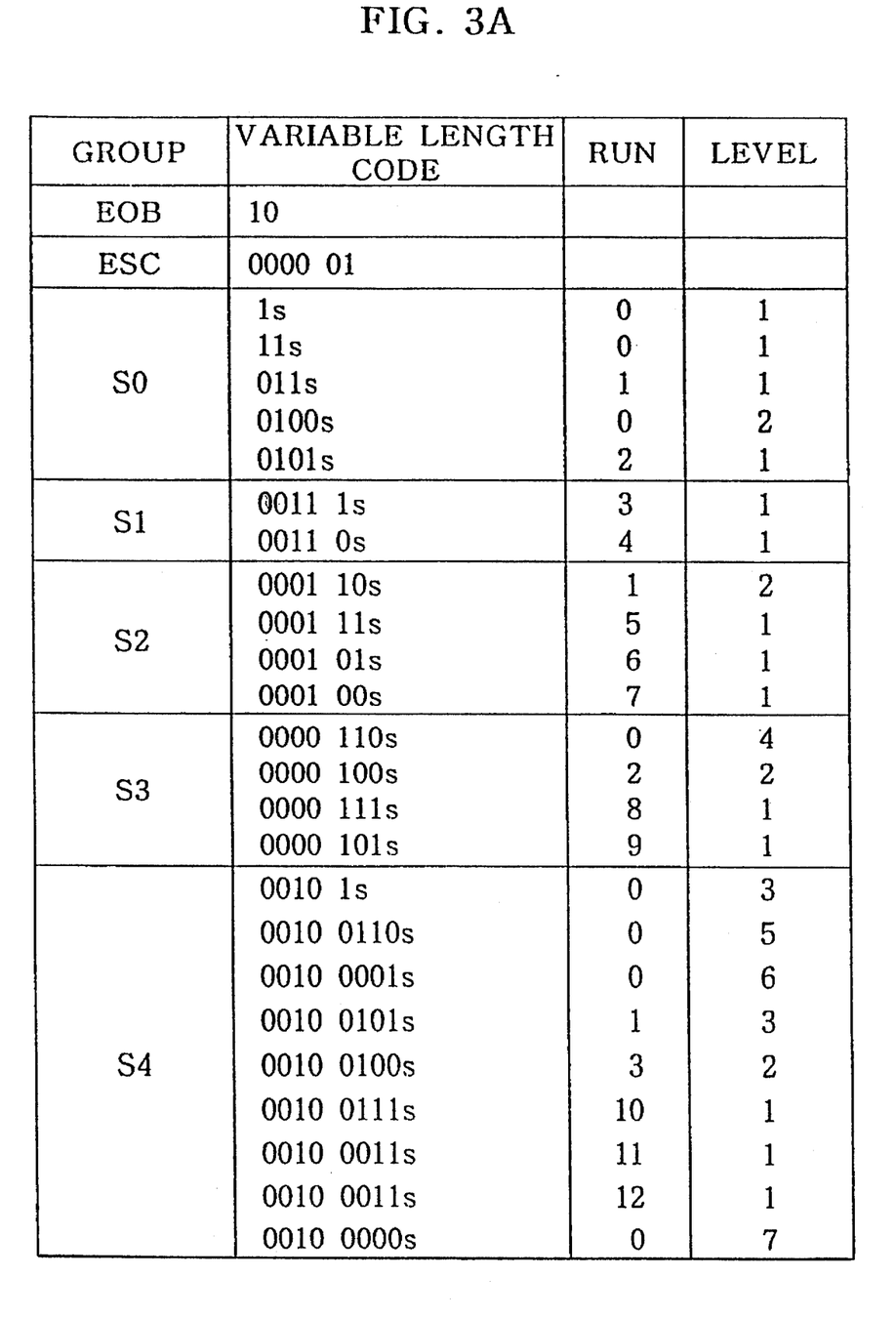
FIGS. 3A to 3C show variable length code tables which contain discrete cosine transform coefficients.
Figure 3B:
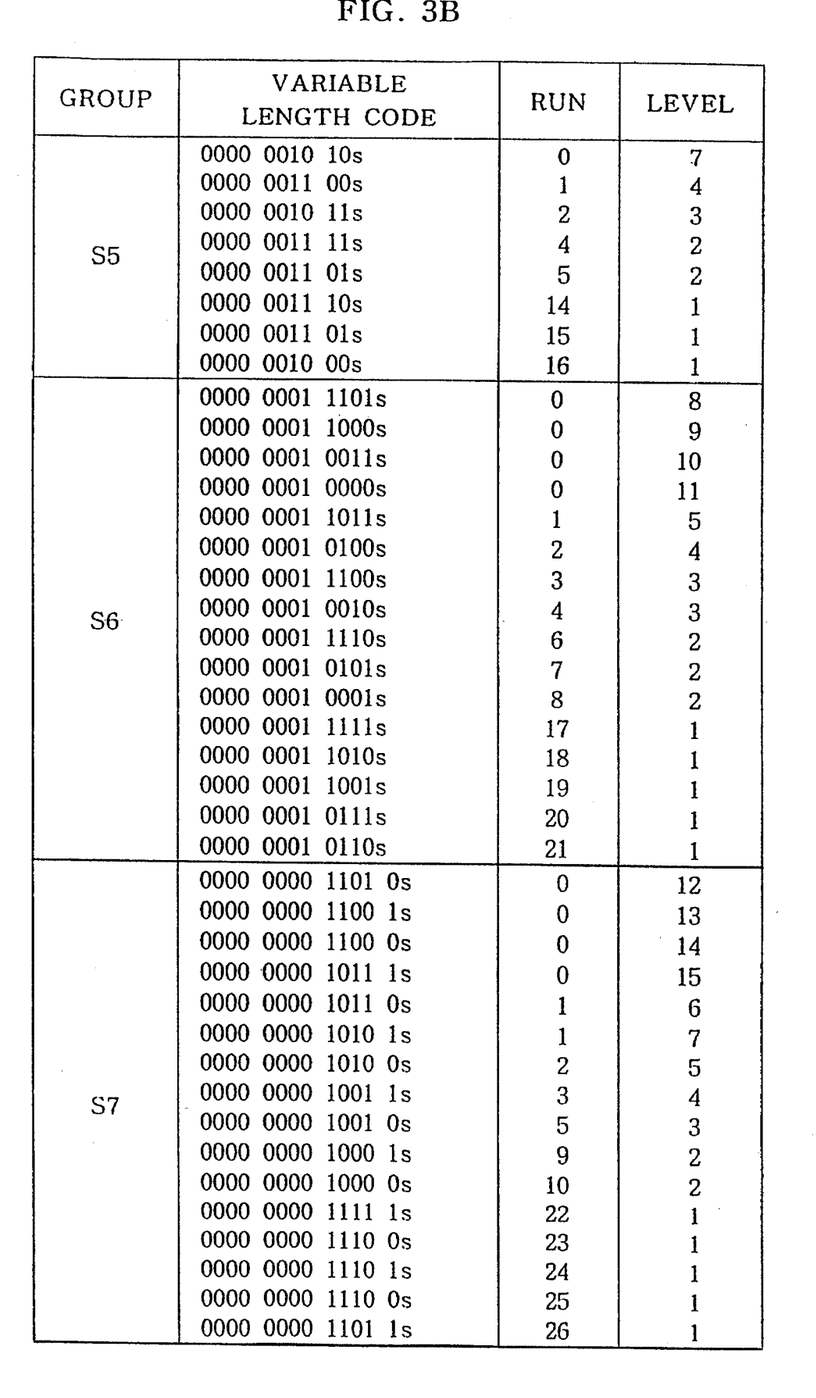
Figure 3C:
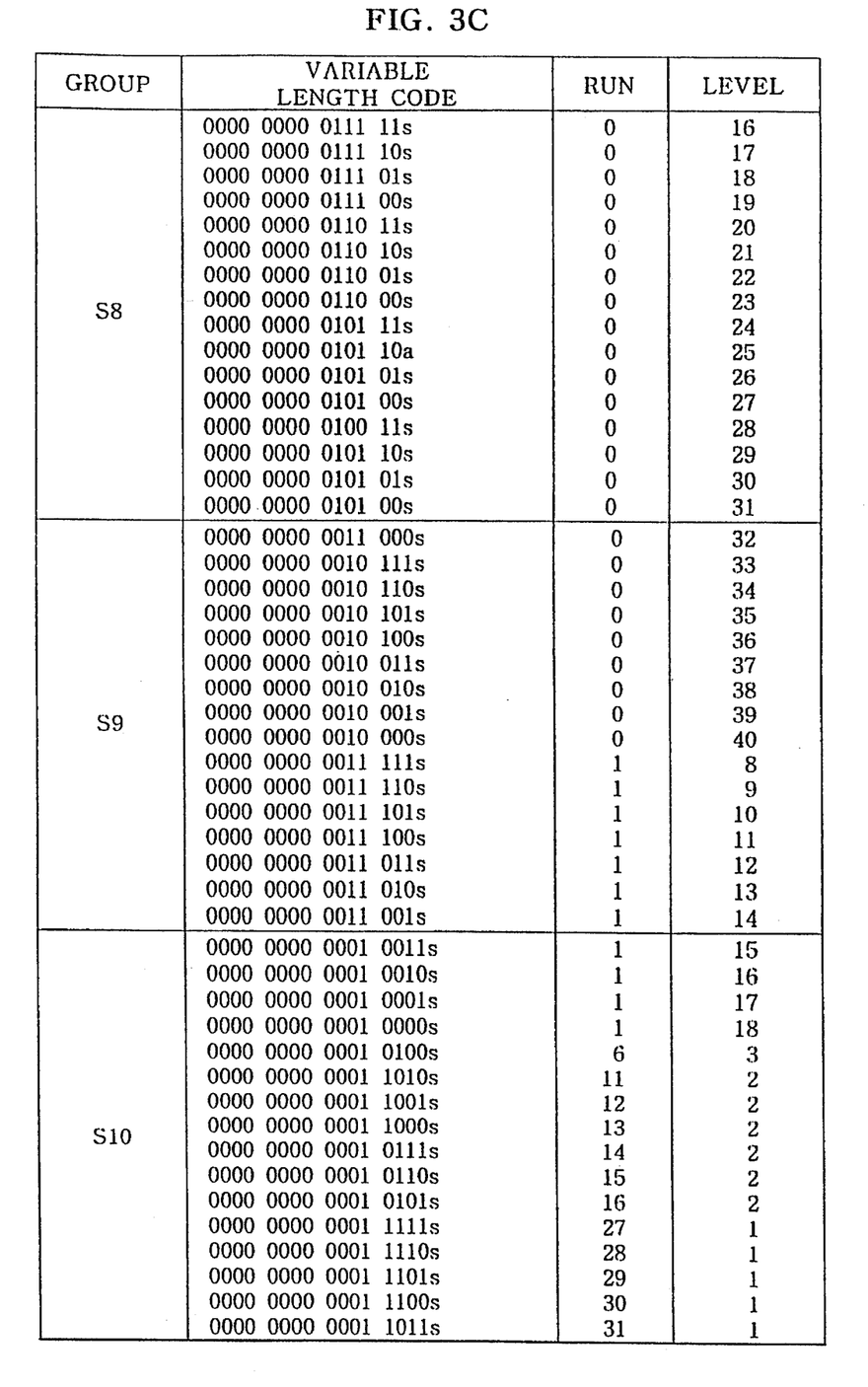

Furthermore, the data contained in the variable length code table shown in FIGS. 3A to 3C has been proposed by the MPEG II in connection with the DCT coefficients and comprises [run, level] symbols and variable length codes which are assigned to the respective [run, level] symbols. However, the sequence of the rows of data in the tables has been rearranged such that it is different from the sequence of the rows of data in the code tables proposed by the MPEG II. In particular, the variable length code tables shown in FIGS. 3A to 3C have been rearranged so that the variable length codes are grouped together based on the values of their most significant bits (MSB). For example, the group $S_2$ is formed by the codes which have "0001" as their most significant bits, and the group $S_3$ is formed by the codes which have "00001" as their most significant bits. As a result of the rearranged data, the variable length codes are divided into thirteen groups EOB, ESC, and $S_0$–$S_{10}$.

In addition, the variable length codes contained in groups $S_0$–$S_{10}$ further comprise a sign bit s which is located at the end of each variable length code and which represents the sign of the level data which is associated with the particular code. Specifically, if the value of the sign bit s equals "1", the sign of the level data is positive, and if the value of s equals "0" the sign of the level data is negative.

Figure 2:
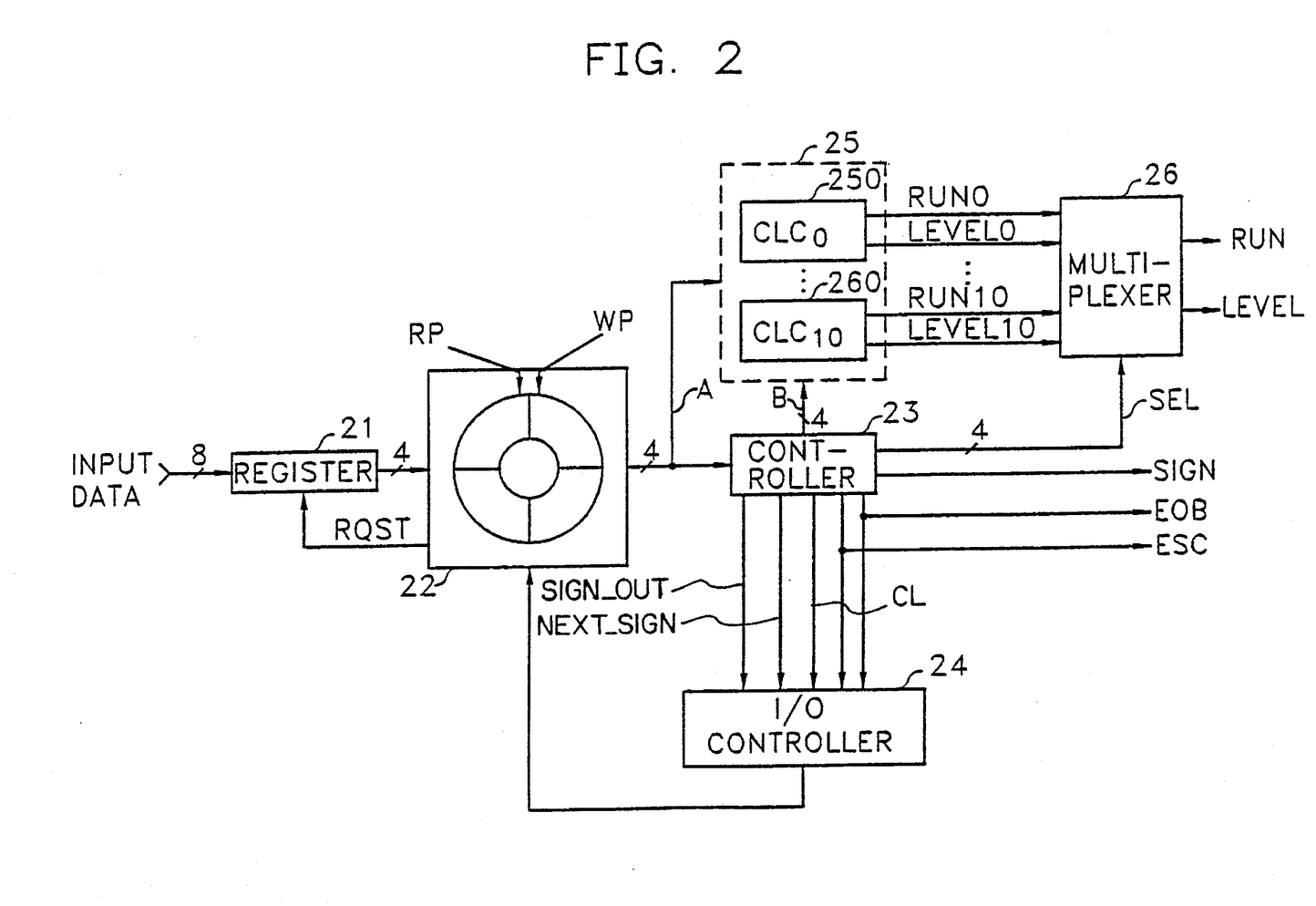
FIG. 2 is a block diagram of a variable length decoder according to a preferred embodiment of the present invention.

FIG. 2 shows an apparatus for decoding input data on the basis of the rearranged variable length code tables shown in FIGS. 3A to 3C. In particular, the apparatus comprises a register 21 which receives 8-bit parallel data and outputs 4-bit parallel data. The 8-bit parallel data is generated by converting a bitstream of variable length coded data into parallel data. For example, the data conversion may be accomplished via a serial-to-parallel conversion type first-in-first-out (FIFO) memory (not shown).

The apparatus also comprises a circular queue memory 22 for storing the 4-bit parallel data output from register 21, and the memory 22 includes four sections which each contains a 4-bit storage region. As a result, the circular queue memory 22 can store 16-bits of data at the same time.

In order to input 4-bits of data from the register 21, the circular queue memory 22 generates a data request signal RQST. Based on the data request signal RQST, the register 21 outputs the 4-bits of parallel data, and the circular queue memory 22 stores the data in a memory location identified by a recording window designated by a write pointer WP. Moreover, in response to various control signals, the circular queue memory 22 outputs 4-bits of parallel data $A_3A_2A_1A_0$ stored in a memory location identified by a reading window designated by a read pointer RP. In particular, the recording window and the reading window are 4-bits in length, and the initial positions of the windows are respectively designated by the write and read pointers WP and RP.

The output data $A_3A_2A_1A_0$ of circular queue memory 22 is applied to both a controller 23 and a combination logic portion 25. Based on the value of the input data $A_3A_2A_1A_0$, the controller 23 generates a sign signal SIGN, a sign output signal SIGN_OUT, a next signal NEXT_SIGN, a control length signal CL, an EOB code, an ESC code, and/or a select signal SEL. The signals SIGN, SIGN_OUT, NEXT_SIGN, CL, EOB, and/or ESC are supplied to an input and output (I/O) controller 24, and the select signal SEL is supplied to a multiplexer 26. Furthermore, the sign signal SIGN, EOB code, and ESC code are supplied to a quantizer (not shown).

The controller 23 also outputs 4-bit data $B_3B_2B_1B_0$ to the combination logic portion 25. The data $B_3B_2B_1B_0$ represents the data which has been received from the circular queue memory 22 immediately before the current data $A_3A_2A_1A_0$ has input from the memory 22.

The combination logic portion 25 comprises eleven combination logic circuits 250 to 260 which respectively correspond to the groups $S_1$–$S_{10}$ of the variable length codes. The circuits 250 to 260 are represented by the abbreviation CLC and are identified by subscripts as shown in FIG. 2. The combination logic circuits 250 to 260 combine the data $A_3A_2A_1A_0$ output from circular queue memory 22 with the data $B_3B_2B_1B_0$ output from controller 23 based on predetermined combination logic. (See Table 2 below). Then, based on the combination logic, the circuits 250 to 260 each output corresponding [run, level] data. The multiplexer 26 receives the select signal SEL from the controller 23 and selectively outputs one of the [run, level] data output from the each of the combination logic circuits 250 to 260.

The I/O controller 24 is located between controller 23 and circular queue memory 22 and controls the data written to or read from the circular queue memory 22. Specifically, the I/O controller 24 inputs the sign output signal SIGN_OUT, the next signal NEXT_SIGN, the code length signal CL, the EOB code, and the ESC code from the controller 23 and determines the values of the write and read pointers WP and RP based on such signals. Furthermore, the I/O controller 24 generates the values of the read and write pointers RP and WP such that the starting position of the recording window (designated by the write pointer WP) always leads the starting portion of the reading window (designated by the read pointer) by one section within the memory 22. Also, the I/O controller 24 determines the value of the write pointer WP so that the reading window is incrementally shifted by one section of the memory 22. In other words, the value of the write pointer WP is changed by four bits every time the starting position of the reading window is shifted by the read pointer to the next section of the memory 22.

The operation of the apparatus above will be described below. First, the register 21 outputs the 4-bit data to the circular queue memory 22 after receiving the data request signal RQST from the memory 22. Subsequently, the circular queue memory 22 stores the 4-bit data in the recording window having the starting position identified by the current write pointer WP. Then, the I/O controller 23 outputs a new read pointer to the memory 22, and the memory 22 outputs to the controller 23 the 4-bit data $A_3A_2A_1A_0$ stored in the location of the reading window having the starting position identified by the read pointer. Also, after receiving the new read pointer, the circular queue memory 22 generates a new data request signal RQST and outputs the signal RQST to the register 21 to receive new 4-bit data.

The controller 23 determines whether or not the 4-bit data $A_3A_2A_1A_0$ output from the circular queue memory 22 belongs to one of groups EOB, ESC and $S_0$–$S_{10}$ based on the contents of Table 1 shown below.

TABLE 1

| Group | 1st Code State | 2nd Code State | 3rd Code State |
|---|---|---|---|
| EOB | 10XX | | |
| ESC | 0000 | 01XX | |
| $S_0$ | 1XXX | | |
| | 11XX | | |
| | 01(1X) | | |
| | 01(0X) | | |
| $S_1$ | 0011 | | |
| $S_2$ | 0001 | | |
| $S_3$ | 0000 | 1XXX | |
| $S_4$ | 0010 | (1XXX) | |
| | 0010 | (0XXX) | |
| $S_5$ | 0000 | 001X | |
| $S_6$ | 0000 | 0001 | |
| $S_7$ | 0000 | 0000 | 1XXX |
| $S_8$ | 0000 | 0000 | 01XX |
| $S_9$ | 0000 | 0000 | 001X |
| $S_{10}$ | 0000 | 0000 | 0001 |

In Table 1, the character "X" and the bit values shown in parentheses represent bit positions which are not considered in determining the group ESC, EOB, and $S_0$ to $S_{10}$ to which the 4-bit data $A_3A_2A_1A_0$ belongs. Furthermore, the code states shown in Table 1 represent the number of sets of 4-bit data that must be input to determine with which group the particular variable length code is associated. For instance, if the variable length code belongs to group $S_0$, the controller 23 can determine such group $S_0$ after inputting one set of 4-bit data. In other words, such a determination can be made based on the first code state shown in Table 1. On the other hand, if the variable length code belongs to group $S_{10}$, the controller 23 can only determine such group $S_{10}$ after inputting three sets of 4-bit data. In other words, such a determination is made according to the third code state shown in Table 1. After determining the appropriate group, the controller 23 generates the corresponding signals SIGN, SIGN_OUT, NEXT_SIGN, CL, EOB, ESC and/or SEL.

For instance, the number of the significant bits used to determine the group to which the 4-bit data $A_3A_2A_1A_0$ (and thus, the variable code length) belongs is represented by the code length signal CL. In particular, the code length signal CL represents the number of bits in the highest code state (i.e. the first, second, or third code state) considered by the controller 23 in determining the group to which the data $A_3A_2A_1A_0$ belongs. For instance, in the groups EOB, $S_0$–$S_2$ and $S_4$, the code length signal CL equals the number of the bits in the corresponding first code state value excluding the bits denoted by the character "X" and the bits in parentheses. For example, in case of the group EOB, the signal CL equals "2". In the groups ESC, $S_3$, $S_5$, and $S_6$, the code length signal CL equals the number of the bits in the corresponding second code state value excluding the bits denoted by the character "X" and the bits in parentheses. Finally, in the groups $S_7$–$S_{10}$, the signal CL is equal to the number of the bits in the corresponding third code state value excluding the bits denoted by the character "X."

The sign output signal SIGN_OUT has a value of "1" when the sign bit s is contained in the 4-bit data $A_3A_2A_1A_0$ which is currently input by the controller 23. On the other hand, the signal SIGN_OUT equals "0" if the sign bit s is not included in the 4-bit data $A_3A_2A_1A_0$.

The controller 23 also generates the next signal NEXT_SIGN if it cannot determine the group to which the 4-bit data belongs (e.g. the 4-bit data of the first code state) and must input another set of 4-bit data (e.g. the 4-bit data of the second code state) to determine with which group the 4-bit data is associated. The next signal NEXT_SIGN will be described in greater detail below.

A sign signal SIGN represents a sign bit of the level data which corresponds to the variable length code currently being input. Furthermore, the EOB and ESC codes have been described referring to FIG. 1.

The operations of the controller 23, the I/O controller 24, and circular queue memory 22 will be described in more detail with reference to Table 1 and FIGS. 3A to 3C. As indicated above, the controller 23 performs a group determination operation to ascertain the group EOB, ESC, and $S_0$ to $S_{10}$ to which a currently input 4-bit data $A_3A_2A_1A_0$ belongs. If the controller 23 can identify a particular group based on the current 4-bit data $A_3A_2A_1A_0$ and the corresponding code state, the controller 23 generates the appropriate signals EOB, ESC, SIGN_OUT, NEXT_SIGN and/or CL. Moreover, the controller 23 outputs the select signal SEL to the multiplexer 26 to inform the multiplexer 26 of the identified group.

If data relating to the groups EOB, $S_0$–$S_2$ and $S_4$ are input, the corresponding group can be determined based on only current 4-bit data $A_3A_2A_1A_0$. For example, if the 4-bit data $A_3A_2A_1A_0$ belongs to group $S_0$, the data will have one of the following first code state values: "1XXX", "11XX", "01 (1X)", or "01 (0X)". (See Table 1). Accordingly, the controller 23 determines that the particular group is group $S_0$ and generates sign signal SIGN, a sign output signal SIGN_OUT, and a code length signal CL.

Specifically, if the 4-bit data corresponds to the variable length code "1s", "11s", or "011s" of group $S_0$, the sign bit s is included in the current 4-bit data $A_3A_2A_1A_0$. (See FIG. 3A). Accordingly, controller 23 generates a sign output signal SIGN_OUT which is equal to "1" and outputs a sign signal SIGN which is equal to the value of the sign bit s. Furthermore, if the variable length code equals "1s", the controller 23 outputs a code length signal CL which is equal to "1". On the other hand, if the code equals "11s" or "011s", the controller 23 outputs a code length signal CL which is equal to "2". (See Table 1).

If the 4-bit data of group $S_0$ corresponds to the variable length code "0100s" or "0101s", the sign bit s is not included in the current 4-bit data $A_3A_2A_1A_0$. (See FIG. 3A). Thus, the controller 23 generates a sign output signal SIGN_OUT which is equal to "0". Also, the controller 23 outputs a code length signal CL which is equal to "2". (See Table 1).

In addition, if the variable length code is equal to "1s", "11s", "011s", "0100s", or "0101s", the controller 23 outputs a select signal SEL which indicates that the current 4-bit data belongs to group $S_0$. As a result, the multiplexer 26 is able to selectively output the proper [run, level] data from the combination logic portion 25 based on the signal SEL.

When the controller 23 determines that the EOB code is contained in the currently input 4-bit data $A_3A_2A_1A_0$, the controller 23 outputs the EOB code to the I/O controller 24 and a quantizer (not shown). Since the EOB code does not have sign bit "s", the controller 23 generates a sign output signal SIGN_OUT having a value of "0".

However, when a particular group corresponding to the currently input 4-bit data $A_3A_2A_1A_0$ cannot be determined based on the first code state values, the controller 23 stores the first code state value of the currently input 4-bit data $A_3A_2A_1A_0$ and generates the next signal NEXT_SIGN. For example, when the currently input 4-bit data $A_3A_2A_1A_0$ has the first code state value corresponding to groups ESC, $S_3$ and $S_5$–$S_{10}$ (i.e. the first code state value equals "0000"), the controller 23 cannot identify the particular group. (See Table 1). In this case, since the specific group has not been determined, the signals CL and SEL are not generated, and the 4-bit data $A_3A_2A_1A_0$ is not supplied to combination logic portion 25. Accordingly, the controller 23 must input an another set of 4-bit data $A_3A_2A_1A_0$ relating to the second code state. (Please note that when the other set of 4-bit data $A_3A_2A_1A_0$ is input, the 4-bit data relating to the first code state becomes the previous 4-bit data $B_3B_2B_1B_0$).

After the current 4-bit data $A_3A_2A_1A_0$ is input, the I/O controller 24 determines values of the write and read pointers WP and RP on the basis of the signals EOB, ESC, NEXT_SIGN, SIGN_OUT and/or CL supplied from controller 23. When both the sign output signal SIGN_OUT and the code length signal CL are output to the I/O controller 24, the I/O controller 24 determines the value of the read pointer by adding the signal SIGN_OUT and the signal CL. Thus, when the sign bit s is contained in the current 4-bit data $A_3A_2A_1A_0$ output from the circular queue memory 22, the sign bit is excluded from the 4-bit data to be subsequently output from the circular queue memory 22.

Also, when both the next signal NEXT_SIGN and the signal CL are output to the I/O controller 24, the I/O controller 24 shifts the values of the read and write pointers RP and WP by the number of bits of the 4-bit data (i.e. by "4" bits). Thus, the positions of the reading and recording windows designated by the read and write pointers RP and WP are respectively shifted to the subsequent sections of the memory 22 by one section. For example, when the current 4-bit data $A_3A_2A_1A_0$ input to the controller 23 has the first code state value of "0000" in group $S_3$, the 4-bit data to be subsequently output from the circular queue memory 22 equals "1XXX". Therefore, if the starting position in the reading window is shifted to the following section of the circular queue memory 22, the memory 22 generates the RQST signal, and the register 21 supplies the 4-bit data "1XXX" to the memory 22 Then, the circular queue memory 22 stores the 4-bit data "1XXX" in the position designated by the recording window.

When the 4-bit data located in the reading window is supplied to the controller 23, the controller 23 determines whether the 4-bit data $A_3A_2A_1A_0$ belongs to group EOB, ESC, or $S_1$–$S_{10}$. When a specific group cannot be determined by the 4-bit data $A_3A_2A_1A_0$ based on the first code state value, the controller 23 determines whether the 4-bit data $A_3A_2A_1A_0$ belongs to group ESC, $S_3$, or $S_5$–$S_{10}$. In other words, the controller 23 determines whether or not the 4-bit data $A_3A_2A_1A_0$ equals "0000". If the data $A_3A_2A_1A_0$ is considered to relate to one of the groups ESC, $S_3$, and $S_5$–$S_{10}$, the controller 23 inputs another 4-bit data $A_3A_2A_1A_0$ (the 4-bit data of the first code state is now considered to be the previous 4-bit data $B_3B_2B_1B_0$). Subsequently, the controller 23 generates the corresponding signals CL, SIGN_OUT, NEXT_SIGN and/or SEL based on the particular group and the second code state value which corresponds to the particular group. (See Table 1). In addition, the controller 23 outputs the current 4-bit data $A_3A_2A_1A_0$ and the previous 4-bit data $B_3B_2B_1B_0$ to combination logic portion 25.

The determination of the particular group based on 8-bits of data is the same as the determination using only 4-bits of data except that the code states used for the determination of the code length signal CL differ from each other. Accordingly, the detailed description of determining the particular group based on 8-bits of data will be omitted. Furthermore, when the particular group cannot determined by 8-bits of data, the controller 23 determines the particular group based on 12-bits of data. In other words, the controller 23 stores the first and second code state values (which have been determined on the basis of the previous 8-bits of data) and determines the particular group on the basis of the stored first and second code state values and the next value of the current 4-bit data $A_3A_2A_1A_0$. Accordingly, the process of determining the particular group based on 12-bits of input data is also similar to the situation in which the group is determined with only 4-bits of data.

In the above description, when the group is not determined on the basis of the current 4-bit data, the controller 23 determines the particular group based partially on the stored first code state value. However, in another embodiment, the controller 23 may store the signal NEXT_SIGN for each code state and determine the particular group based on the stored signal NEXT_SIGN.

The combination logic portion 25 receives the 4-bit data $A_3A_2A_1A_0$ output from circular queue memory 22 and the 4-bit data $B_3B_2B_1B_0$ output from controller 23 and comprises eleven combination logic circuits 250 to 260. Furthermore, the combination logic circuits 250 to 260 have input combination logic states represented by Table 2 as illustrated below.

TABLE 2

| COMBINATIONAL LOGIC | INPUT COMBINATIONAL STATES |
| --- | --- |
| $CLC_0$ | $A_3A_2A_1A_0$ |
| $CLC_1$ | $A_3$ |
| $CLC_2$ | $A_3A_2$ |
| $CLC_3$ | $A_2A_1$ |
| $CLC_4$ | $A_3A_2A_1A_0$ |
| $CLC_5$ | $B_0A_3A_2$ |
| $CLC_6$ | $A_3A_2A_1A_0$ |
| $CLC_7$ | $B_2B_1B_0A_3$ |
| $CLC_8$ | $B_1B_0A_3A_2$ |
| $CLC_9$ | $B_0A_3A_2A_1$ |
| $CLC_{10}$ | $A_3A_2A_1A_0$ |

The combination logic circuit 250 to 260 respectively store the combination logic $CLC_0$ to $CLC_{10}$, and the combination logic circuits $CLC_1$ to $CLC_{10}$ respectively correspond to the groups $S_0$ to $S_{10}$. In other words, the combination logic circuit 250 stores variable length codes belonging to group $S_0$ and [run, level] data corresponding to the variable length codes. Similarly, the other combination logic circuits 251 to 260 store variable length codes respectively belonging to the other groups $S_1$ to $S_{10}$ as well as [run, level] data respectively corresponding to the variable length codes.

In addition, the combination logic circuits 250 to 260 do not actually store all bit values of the corresponding variable length codes, but store only some of the bit values located before the sign bit s. As a result, all of the variable length codes in the same group are associated with each other. For example, the combination logic circuit 251 only has to store part of the variable length codes belonging to group $S_1$ shown in FIG. 3A to distinguish the codes within group $S_1$ from each other. In particular, since all four bits $B_3B_2B_1B_0$ of the first code state of all codes within group $S_1$ are equal, the combination logic circuit 251 only needs to store the most significant digit $A_3$ of 4-bit data $A_3A_2A_1A_0$ of the second code state. (See Table 2). In other words, the circuit 251 stores a "1" or "0".

On the other hand, the combinational logic circuit 253 stores a different portion of the variable length codes belonging to the group $S_3$ shown in FIG. 3A. Specifically, since all four bits $B_3B_2B_1B_0$ of the first code state and the most significant bit $A_3$ of the second code state within group $S_3$ are equal for each code in group $S_3$, the circuit 253 only stores the second and third most significant bits $A_2$ and $A_1$ of second code state. (See Table 2) In other words, the circuit 253 stores "10", "00", "11", or "01".

If the 4-bit data $A_3A_2A_1A_0$ from circular queue memory 22 and the 4-bit $B_3B_2B_1B_0$ from controller 23 are output to combination logic portion 25, the combination logic circuits 250 to 260 combine the data $A_3A_2A_1A_0$ and $B_3B_2B_1B_0$ according to the corresponding input combination states shown in Table 2. In this instance, the 4-bit data $B_3B_2B_1B_0$ input from controller 23 is data which was output from circular queue memory 22 immediately before the current 4-bit data $A_3A_2A_1A_0$ was output from the memory 22. For example, the combination logic circuit 250 outputs the [run, level] data which is determined by the input data "$A_3A_2A_1A_0$". If the data "$A_3A_2A_1A_0$" equals "011X", the combination logic circuit 250 outputs the corresponding [run, level] data as [1, 1] as shown in FIG. 3A. On the other hand, the [run, level] data output by the combination logic circuit 255 is determined by the input data "$B_0A_3A_2$". Thus, if "$B_0A_3A_2$" equals "110," the [run, level] data output from the circuit 255 equals [14, 1] as shown in FIG. 3B.

The [run, level] data determined by the respective combination logic circuits 250 to 260 are output to multiplexer 26. Subsequently, the multiplexer 26 selectively outputs the [run, level] data from one of the circuits 250 to 260 based on the select signal SEL output from the controller 23, and the selected [run, level] data is output to an inverse quantizer (not shown).

As described above, the variable length decoding method and apparatus of the present invention does not use a ROM and a barrel shifter. Accordingly, the hardware construction of the present invention is relatively simple and inexpensive to manufacture for a specific application. Also, while only certain embodiments of the invention have been specifically described herein, it will apparent that numerous modifications may be made thereto without departing from the spirit and scope of the invention.

What is claimed is:

1. A variable length decoding apparatus comprising:
    memory means for storing and outputting variable length coded data in increments of N-bit data,
        wherein an increment of said N-bit data which is currently output from said memory means is a current N-bit data, and another increment of said N-bit data which is output before said current N-bit data is a previous N-bit data;
        wherein said memory means outputs said previous N-bit data and shifts said previous N-bit data from an initial bit of said previous N-bit data by a value of a control signal, and
        wherein said memory means subsequently outputs said current N-bit data which has an initial bit that is determined by shifting said previous N-bit data;

control means for inputting said previous and current N-bit data and for determining a particular group of a plurality of groups to which said current N-bit data belongs,
    wherein said plurality of groups comprise variable length codes of a variable length code table and are formed based on characteristics of said variable length codes,
    wherein said control means determines said particular group by comparing code state values with said current N-bit data,
    wherein said code state values respectively correspond to said plurality of groups of said variable length codes, and
    wherein said control means outputs a code length signal which represents a number of bits of one of said code state values used to determine said particular group, a select signal which represents said particular group, and said previous N-bit data;
combination logic means for generating a plurality of symbols,
    wherein said combination logic means comprises a plurality of input logic combinations which respectively correspond to said plurality of groups,
    wherein values of said plurality of input logic combinations are determined based on said previous N-bit data output from said control means and said current N-bit data output from said memory means,
    wherein said plurality of symbols are respectively obtained for each of said plurality of groups based on said values of said input logic combinations; and
a multiplexer for receiving said plurality of symbols generated by said combination logic means and for selectively outputting a selected symbol from said plurality of symbols based on said select signal from said control means.

2. The variable length decoding apparatus according to claim 1, wherein a length of said N-bit data is determined by a pattern of bit data constituting said variable length codes of said variable length code table.

3. The variable length decoding apparatus according to claim 2, wherein said N-bit data is 4-bit data.

4. The variable length decoding apparatus according to claim 1, wherein each of said plurality of groups is formed by grouping together said variable length codes that have most significant bits which are identical.

5. The variable length decoding apparatus according to claim 1, wherein said variable length code table is a table of transformation coefficients obtained by a discrete cosine transform method.

6. The variable length decoding apparatus according to claim 1, wherein said memory means comprises:
    a circular queue memory comprising a reading window region having a size equal to said N-bit data and having a position determined by a value of a reading pointer,
        wherein said circular queue memory outputs an increment of said N-bit data when said reading window region coincides with an address location of said increment of said N-bit data; and
    an input and output controller for altering said value of said reading pointer according to said control signal generated by said control means.

7. The variable length decoding apparatus according to claim 6, wherein said memory means further comprises:
    a register for storing said variable length coded data,
    wherein said register outputs an increment of said N-bit data to said circular memory means whenever a data request signal is supplied to said register,
    wherein said circular queue memory is divided into a plurality of sections each having a storage region having a size equal to said N-bit data,
    wherein said circular queue memory generates said data request signal whenever said value of said reading pointer is altered so as to designate a different one of said plurality of sections, and
    wherein said N-bit data is respectively stored in one of said plurality of sections in response to said data request signal.

8. The variable length decoding apparatus according to claim 1, wherein said control means generates said code length signal and a sign output signal when said particular group is determined, wherein said sign output signal indicates whether or not said current N-bit data comprises a sign bit when said control means determines said particular group to which said current N-bit data belongs.

9. The variable length decoding apparatus according to claim 8, wherein said control signal output from said control means represents information contained in said code length signal and said sign output signal.

10. The variable length decoding apparatus according to claim 1, wherein said control signal generated by said control means comprises indication information for indicating that said particular group cannot be determined based on said current N-bit data when said control means does not identify one of said plurality of groups to which said current N-bit data belongs.

11. The variable length decoding apparatus according to claim 10, wherein said indication information represents a number of bits of said N-bit data.

12. The variable length decoding apparatus according to claim 1,
    wherein said combination logic means comprises a plurality of combination logic circuits for outputting run data and level data,
    wherein said combination logic circuits each generate said run data and said level data based on a minimum number of data bits,
    wherein said minimum number of data bits is a minimum number necessary for each of said combination logic circuits to identify said variable length codes belonging to a corresponding one of said plurality of groups, and
    wherein said minimum number of data bits is selected from said current N-bit data and said previous N-bit data.

13. A variable length decoding method comprising the steps of:
    (a) establishing code state values for selecting a particular group from a plurality of groups,
        wherein said plurality of groups comprise variable length codes of a variable length code table and said particular group comprises a particular variable length code relating to a current N-bit data;
    (b) establishing a plurality of input combinations which have values that are determined by said current N-bit data and previous N-bit data,
        wherein said plurality of input combinations respectively correspond to said plurality of groups, and
        wherein a plurality of symbols respectively correspond to said values of said plurality of input combinations;
    (c) storing and outputting variable length coded data in increments of N-bit data,
        wherein said current N-bit data is an increment of said N-bit data which is currently output and said previous N-bit data is another increment of said N-bit data which is output before said current N-bit data, wherein said current N-bit data is output by shifting a first bit of said previous N-bit data to a first bit of said current N-bit data in accordance with a value of a control signal;

(d) determining said particular group corresponding to said current N-bit data by comparing said code state values established in step (a) with said current N-bit data output in step (c), wherein a code length signal representing a number of bits of one of said code state values used to determine said particular group, a select signal representing said particular group, and said previous N-bit data are output after determining said particular group; and (e) determining a plurality of symbols based on said current N-bit data and said previous N-bit data output in step (c), wherein said plurality of symbols correspond to said values of said plurality of input combinations.

14. The variable length decoding method according to claim 13, wherein step (a) further comprises the step of:

dividing said variable length codes into said plurality of groups by grouping together said variable length codes that have most significant bits which are identical.

15. The variable length decoding method according to claim 13, wherein a length of said N-bit data is determined by a pattern of bit data constituting said variable length codes of said variable length code table.

16. The variable length decoding method according to claim 15, wherein said N-bit data is 4-bit data.

17. The variable length decoding method according to claim 13, wherein step (b) further comprises the step of:

storing only a minimum number of bit values necessary to identify said variable length codes belonging to each of said plurality of groups and storing symbols respectively corresponding to said minimum number of bit values.

18. The variable length decoding method according to claim 13, wherein step (d) further comprises the step of:

(d1) generating said code length signal and a sign output signal when said particular group is determined, wherein said sign output signal indicates whether or not said current N-bit data comprises a sign bit when said particular group to which said current N-bit data belongs is determined.

19. The variable length decoding method according to claim 18, wherein step (d1) further comprises the step of:

determining said value of said control signal by adding information contained in said code length signal with information contained in said sign output signal.

20. The variable length decoding method according to claim 13, wherein step (d) further comprises the step of:

(d2) generating said control signal such that said control signal comprises information indicating that said particular group cannot be determined based on said current N-bit data when step (d) does not identify one of said plurality of groups to which said current N-bit data belongs.

21. The variable length decoding method according to claim 20, wherein said control signal represents a number of bits of said N-bit data.

22. The variable length decoding method according to claim 13, wherein step (e) comprises the steps of:

(e1) generating said plurality of symbols which respectively correspond to said plurality of groups based on said current N-bit data and said previous N-bit data output in said step (c); and (e2) selecting one of said plurality of symbols generated in step (e1) as a symbol of said variable length decoding method.

* * * * *